US006536813B2

(12) United States Patent
Smith et al.

(10) Patent No.: US 6,536,813 B2
(45) Date of Patent: Mar. 25, 2003

(54) SMIF CONTAINER LATCH MECHANISM

(75) Inventors: Mark V. Smith, Colorado Springs, CO (US); Robert P. Wartenbergh, Woodside, CA (US); William P. Pennybacker, Tracy, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/902,195

(22) Filed: Jul. 10, 2001

(65) Prior Publication Data

US 2002/0021009 A1 Feb. 21, 2002

Related U.S. Application Data

(60) Provisional application No. 60/217,204, filed on Jul. 10, 2000.

(51) Int. Cl.[7] .................................................. E05C 1/04
(52) U.S. Cl. ........................... 292/145; 292/33; 292/37; 292/138; 292/140; 292/157
(58) Field of Search ................................. 292/145, 138, 292/157, 33, 37, 140

(56) References Cited

U.S. PATENT DOCUMENTS

| 907,933 | A | * | 12/1908 | Wisterman | 292/3 |
|---|---|---|---|---|---|
| 4,532,970 | A | * | 8/1985 | Tullis et al. | 141/98 |
| 4,534,389 | A | * | 8/1985 | Tullis | 141/98 |
| 4,739,882 | A | * | 4/1988 | Parikh et al. | 206/454 |
| 4,995,430 | A | * | 2/1991 | Bonora et al. | 141/98 |
| 6,106,213 | A | | 8/2000 | Denker | 414/411 |
| 6,186,331 | B1 | * | 2/2001 | Kinpara et al. | 206/711 |
| 6,223,396 | B1 | * | 5/2001 | Wartenbergh | 16/430 |

FOREIGN PATENT DOCUMENTS

| FR | 677818 | * | 12/1929 | 292/145 |
|---|---|---|---|---|
| GB | 1104346 | * | 2/1968 | 292/145 |

OTHER PUBLICATIONS

Parikh, M., *SMIF: A Technology Wafer Cassette Transfer in VLSI Manufacturing*, Solid State Technology, Jul. 1984, pp. 111–115.

*Notification of Transmittal of the International Search Report or the Declaration*, International Searching Authority, Feb. 25, 2002, 5 pages.

* cited by examiner

*Primary Examiner*—J. J. Swann
*Assistant Examiner*—Carlos Lugo
(74) *Attorney, Agent, or Firm*—O'Melveny & Myers LLP

(57) ABSTRACT

The present invention includes a latch assembly, such as maybe useful for SMIF pods. SMIF pods are in general comprised of a pod door which mates with a pod shell to provide a sealed environment in which wafers may be stored and transferred. During wafer storage and transport, the pod door is typically held affixed to the pod shell by a latch assembly. When it is desired to separate the pod door from the pod shell, each latch must be actuated outwardly, to withdraw each engagement portion from the pod door, at which time the pod door may be separated. The present invention includes an improved such latch assembly.

22 Claims, 7 Drawing Sheets

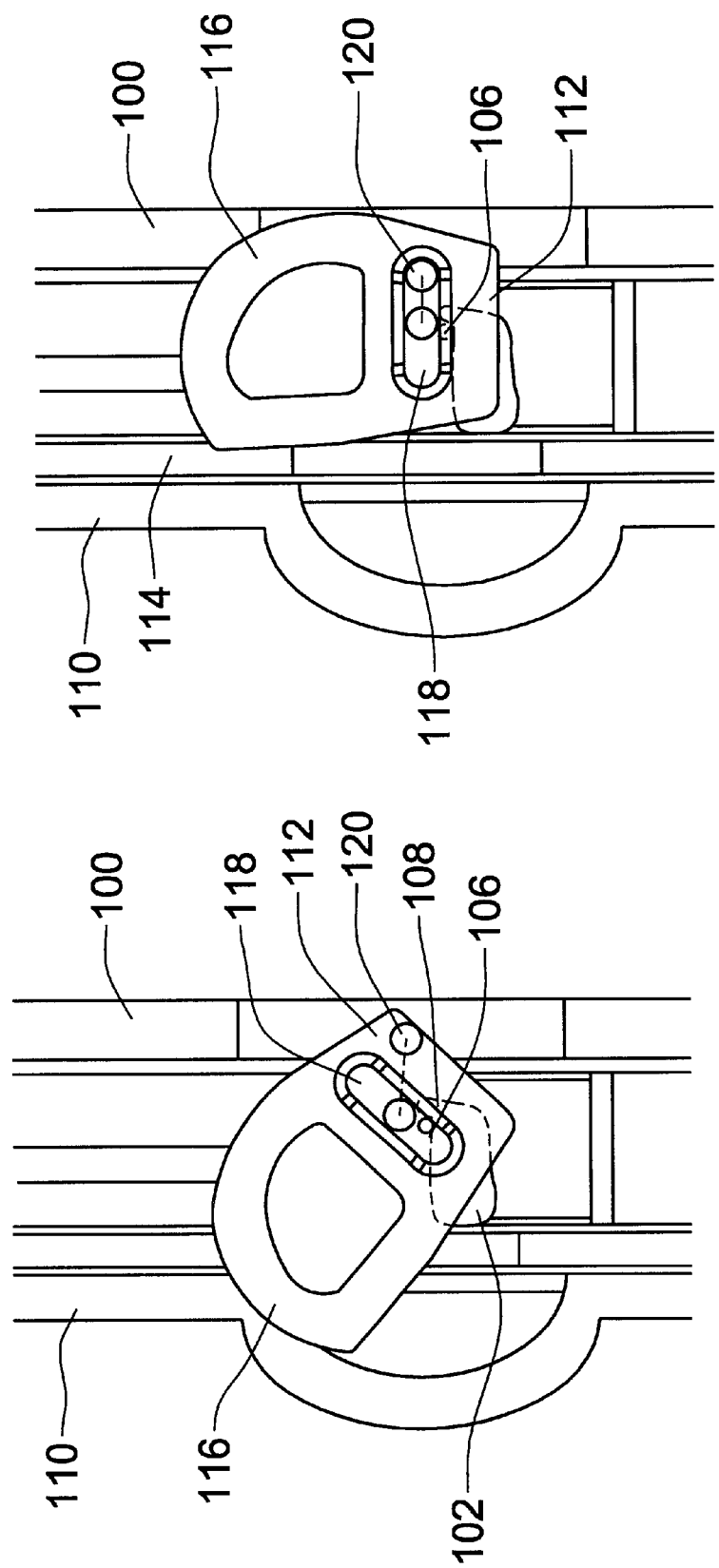

SMIF CONTAINER LATCH MECHANISM

CLAIM OF PRIORITY

This application claims priority to Provisional patent application Ser. No. 60/217,204, filed Jul. 10, 2000, entitled SMIF Container With Latch Lock Mechanism.

BACKGROUND OF THE INVENTION

1. Field of the Invention

The present invention relates to the transfer of workpieces such as semiconductor wafers within a storage and transport pod, and in particular to a latch locking mechanism preventing unwanted opening of the pod.

2. Description of Related Art

A standardized mechanical interface system (SMIF) proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is located in a vertical plane, and the wafers are supported either in a cassette mounted within the pod shell, or to shelves mounted directly in the pod shell itself.

In order to transfer wafers between a SMIF pod and a process tool in a bottom opening system, a pod is typically loaded either manually or automatedly onto a load port on a front of the tool so that the pod door lies adjacent the port door of the process tool. Thereafter, mechanisms within the load port decouple the pod door from the pod shell and lower the pod door and port door together into the minienvironment, with a wafer carrying cassette remaining seated on the pod door. The pod shell remains in position against the interface port to maintain a seal at the port and to define a sealed, clean environment including the interior of the process tool and pod shell. A wafer handling robot within the process tool may thereafter access particular wafers supported in the pod shell for transfer between the pod and the process tool.

During wafer storage and transport, the pod door is typically held affixed to the pod shell by one of two different latch assemblies. In a first system, referred to herein as a perimeter latch assembly, four independently operated latches are mounted to a bottom perimeter of the pod shell, with an engagement portion of each latch extending inward under the pod door to maintain the pod door in a sealed position in the pod. When it is desired to separate the pod door from the pod shell, each of the four latches is actuated outwardly, to withdraw each engagement portion from under the pod door, at which time the pod door may be separated. Each of the latches needs to be actuated outward to disengage the pod door from the pod shell. In conventional perimeter latch systems, the latches may be disengaged manually, or the pod may be seated on a load port or other support surface including four actuation pins. The pins fit into slots formed on each of the latches, and, after the pod is properly positioned on the support surface, the actuation pins move the each of the latches outward to withdraw the engagement portion of each latch from under the pod door. Thereafter, the pod door may be separated from the pod shell.

A single latch of a perimeter latch lock assembly is shown in prior art FIG. 1. As explained above, a latch 20 is mounted on the lower perimeter of pod shell 22, and includes an engagement portion 24 extending under the pod door 26. The latch 20 may be actuated either manually or by means of a pin (not shown) on a support surface engaged within slot 28 so as to move to the left from the perspective of FIG. 1. Once the latch 20 is moved sufficiently so that engagement portion 24 is clear of the pod door (and the other latches are similarly actuated, the pod door may be separated from the pod shell. The latch may be biased into sealing position shown in FIG. 1 by a spring or other biasing scheme, such as leaf spring 30 shown in FIG. 1.

A second type of latch assembly (not shown) is disclosed in U.S. Pat. No. 4,995,430, entitled "Sealable Transportable Container Having Improved Latch Mechanism", to Bonora et al., which patent is owned by the assignee of the present application. The mechanism disclosed therein includes a latch hub centrally mounted within the pod door, which latch hub engages with first and second translating latch plates. The latch plates include ends which extend beyond the footprint of the pod door and into slots in the pod shell. When the latch plates are in an extended position, the ends fit into the slots in the pod shell to seal the pod. When the latch plates are in a retracted position, the ends of the latch plates withdraw into the footprint of the pod door to allow separation of the pod door from the pod shell. When a pod including this type of latch assembly is mounted on a load port or other such support surface, mechanisms within the support surface rotate the hub to move the latch plates between their extended and retracted positions.

In the perimeter latch assembly, it can happen that an operator manually disengages each of the latches to open the pod when in fact the pod should not be opened. Such unwanted pod openings can lead to contamination of the workpieces within the pod and/or an improper exchange of one workpiece lot for another within the pod.

BRIEF SUMMARY OF THE INVENTION

The present invention includes a latch mechanism for latching a first member to a second member, such as a pod door to a pod shell in a semiconductor environment. The latch mechanism includes a latch lock mounted to the first member, comprising a finger portion and an angled portion. A latch is mounted to the first member, adapted to move between a latched position and an unlatched position. The latch has an engagement portion that contacts a portion of the second member when the latch is in the latched position, so as to maintain contact between the first and second members. The latch also has a slot for receiving the finger of the latch lock. An actuation pin is positioned in the slot of the latch. The actuation pin is adapted move laterally between a first position and a second position. The actuation pin slidably contacts the angled portion, such that when the actuation pin moves between the first position and the second position the angled portion moves in a direction orthogonal to the lateral movement. This allows the finger portion to move into and out of the slot. The latch may then be moved between the latched and unlatched positions when the finger portion is not positioned in the slot.

BRIEF DESCRIPTION OF THE DRAWINGS

FIGS. 6A through 6D are bottom views of a pod seated on a support surface including an actuation pin for moving a latch lock out of locking position while opening the perimeter latch, in accordance with one embodiment of the present invention.

DETAILED DESCRIPTION OF THE PREFERRED EMBODIMENT

The present invention will now be described as referenced to FIGS. 2–6D which in preferred embodiments relate to a latch lock for locking a perimeter latch in position to prevent unwanted opening of the pod. It is understood the type of pod is not critical to the present invention, and the pod may house various work pieces such as semiconductor wafers, reticles or flat panel displays. Moreover, while a preferred embodiment of the pod according to the present invention operates according to SMIF technology, it is understood that the present invention may be used with containers operating according to technologies other than SMIF technology in alternative embodiments of the present invention.

Figure 1:
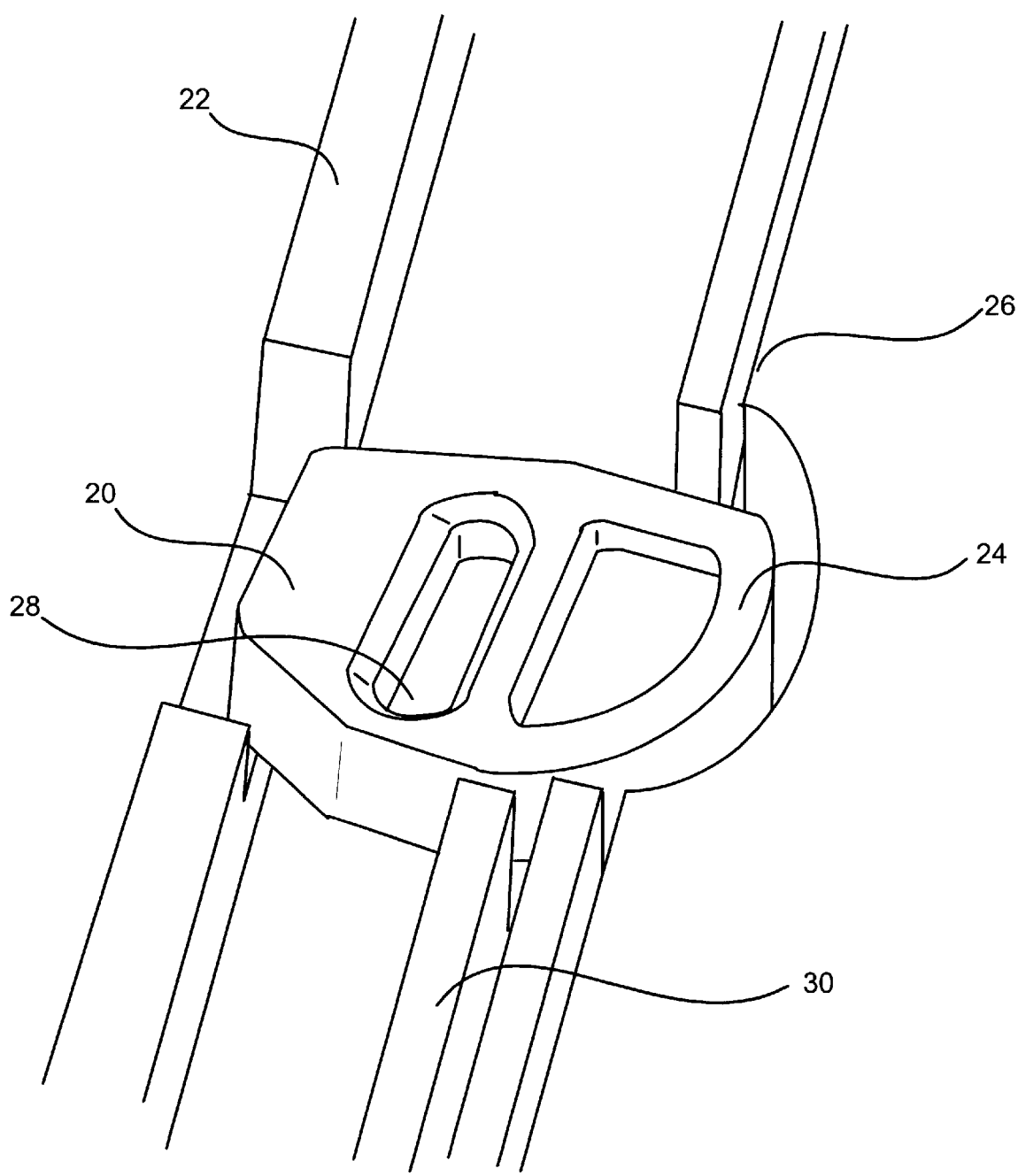
FIG. 1 is a prior art perspective view of a single latch of a perimeter latch assembly.
Figure 2:
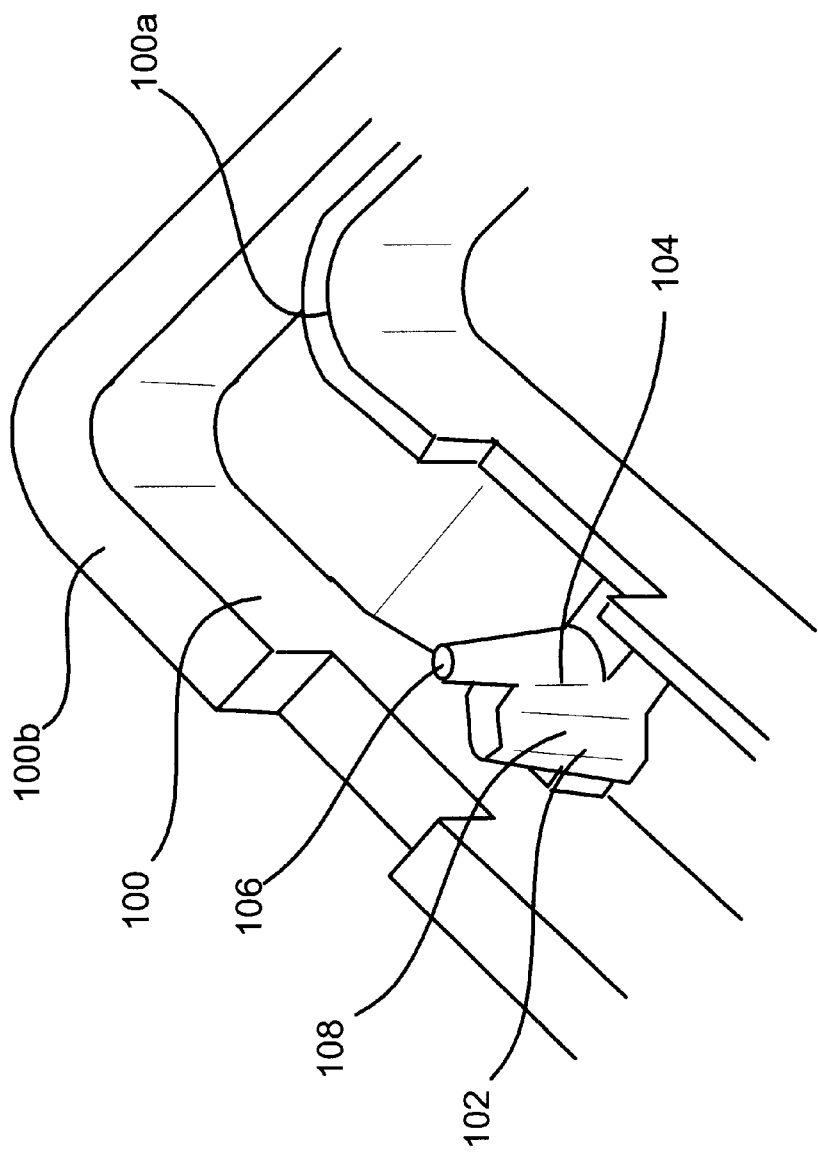
FIG. 2 is a partial bottom perspective view of a pod shell including a latch lock in accordance with one embodiment of the present invention.

Referring now to FIG. 2, there is shown a bottom perspective view of a pod shell 100 including a latch lock 102 according to the present invention. Latch lock 102 may be formed between an inner wall 100a and an outer wall 100b on the pod shell 100, and may be injection molded as part of the pod shell The latch lock 102 may be formed of various polymers including polycarbonate and acrylonitrile-butadiene-styrene (ABS). Although one such latch lock 102 is shown in FIG. 2, it is understood that there is preferably one latch lock for each perimeter latch on the pod. Thus, there are preferably 4 latch locks. The following description applies to each of the latch locks. It is understood that there may be less latch locks than perimeter latches in alternative embodiments.

Latch lock 102 includes a first portion 104 having a finger 106 which represents the lowest point on the latch lock when held in its normal position facing downward. Latch lock 102 further includes a second, angled portion 108 which angled with respect to first portion 104 for purposes as will be explained hereinafter. The latch lock 102 maybe approximately three-quarters of an inch in length and may be flexible so as to deflect as explained hereinafter. It is understood that the latch lock 102 may be longer or shorter than three-quarters of an inch in alternative embodiments.

Figure 3:
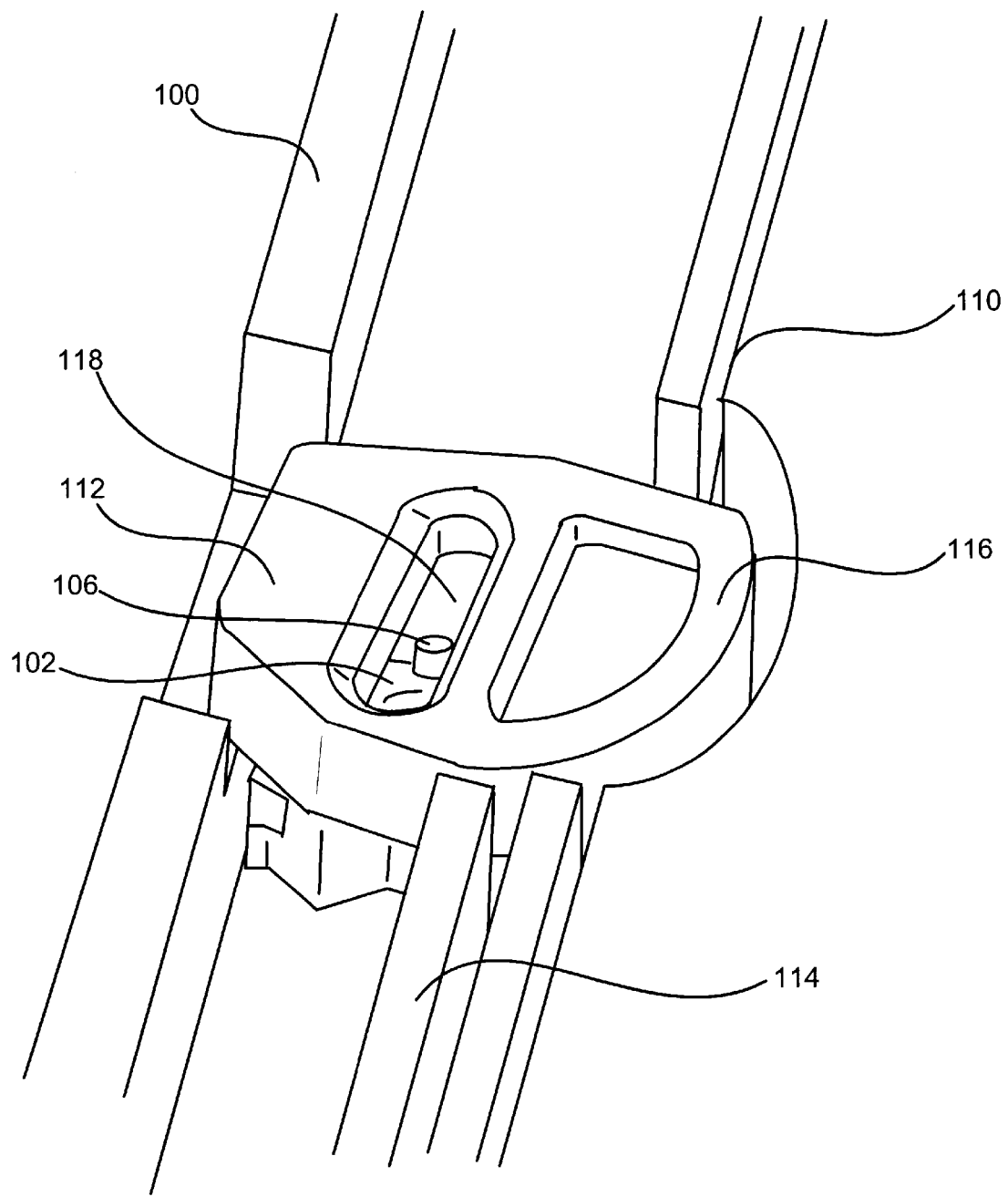
FIG. 3 is a partial bottom perspective view of a pod including a perimeter latch and a latch lock in accordance with one embodiment of the present invention.
Figure 4:
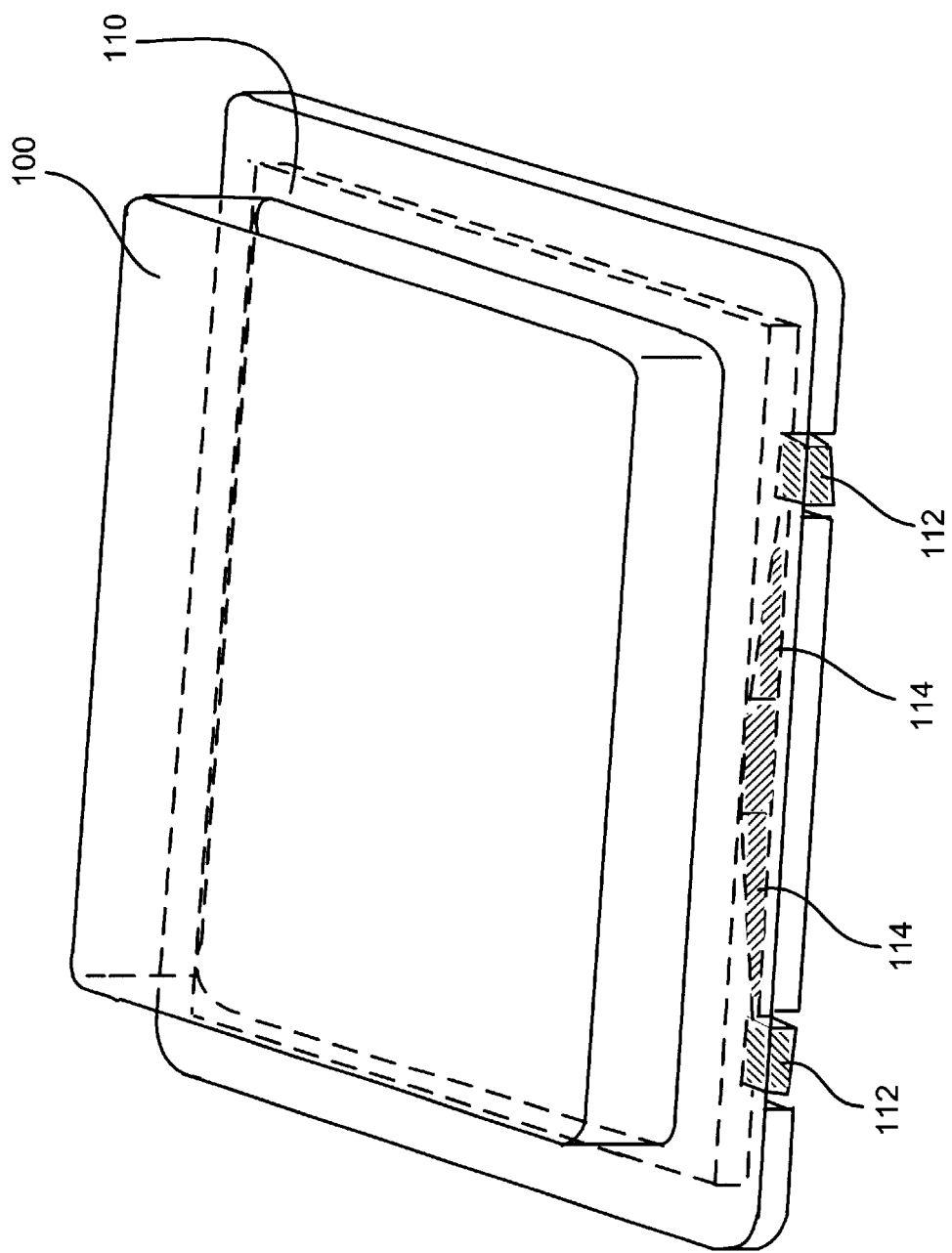
FIG. 4 is a perspective view of a pod including a perimeter latch in accordance with one embodiment of the present invention.

Referring to FIG. 3, there is shown a bottom view of a pod including a pod shell 100 and a pod door 110 which together define a sealed environment (not shown) for a work piece within a container. FIG. 3 further shows a perimeter latch 112 mounted to pod shell 100 via a leaf spring 114. Perimeter latch 112 is preferably of conventional design. As shown in FIG. 4, leaf springs 114 attach to the pod shell and flex to allow perimeter latch 112 to move between an unbiased position shown in FIG. 3 and a flexed position shown for example in FIG. 6D in which the latch 112 allows the pod door 110 to be removed (While FIG. 4 shows a reticle pod, as explained above, the container including a latch lock according to the present invention may house various workpieces).

Latch 112 further includes an engaging portion 116 which extends under a portion of the pod door 110 so as to maintain the pod door 110 sealed within the pod. Latch 112 additionally includes a slot 118 for receiving an actuation pin 120 (explained hereinafter with respect to FIGS. 6A–6D) and for receiving the finger 106 of latch lock 102.

Figure 5A:
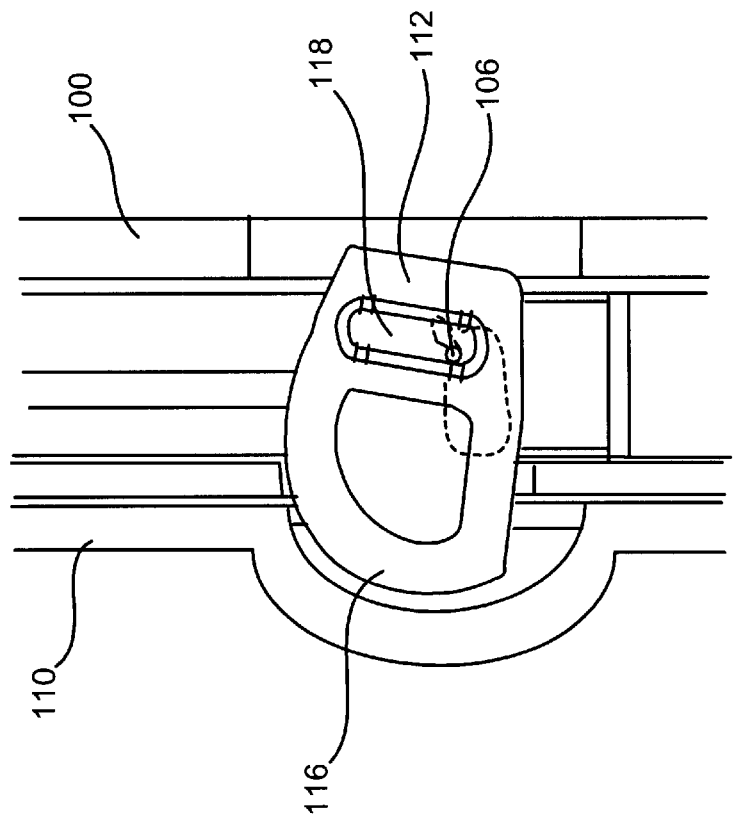
FIGS. 5A and 5B are bottom views of a pod including a perimeter latch and a latch lock in accordance with one embodiment of the present invention.
Figure 5B:
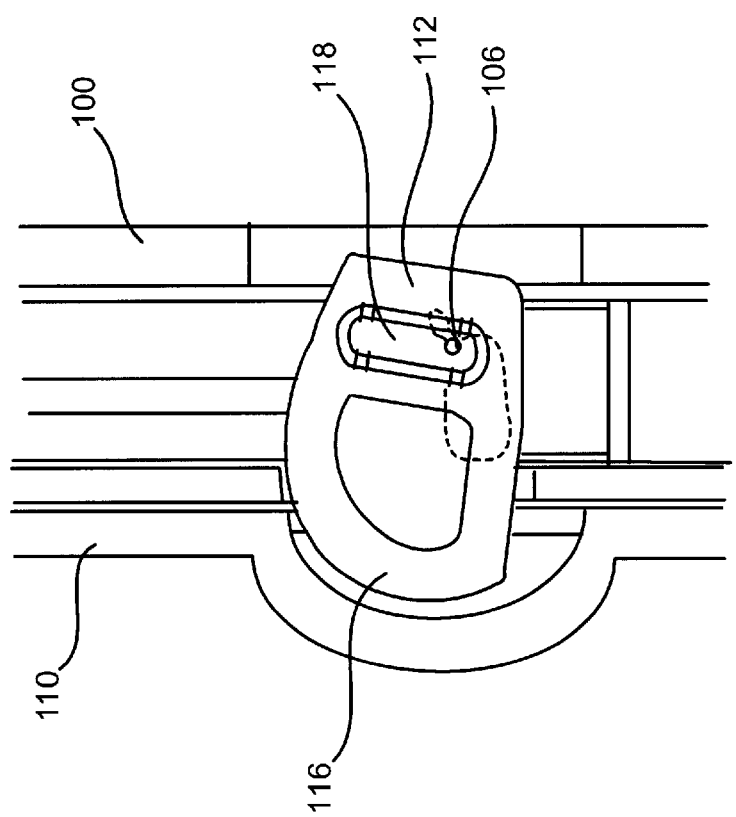

Referring now to FIGS. 5A and 5B, finger 106 extends into slot 118 so that, if an attempt is made to manually move latch 112 to a position free of the pod door, finger 106 abuts against a portion of the wall defining slot 118 as shown in FIG. 5B to prevent the engagement portion 116 from moving clear of the pod door 110. Thus, the latch lock 102 according to the present invention prevents unwanted separation of the pod door from the pod shell.

Figure 6A:
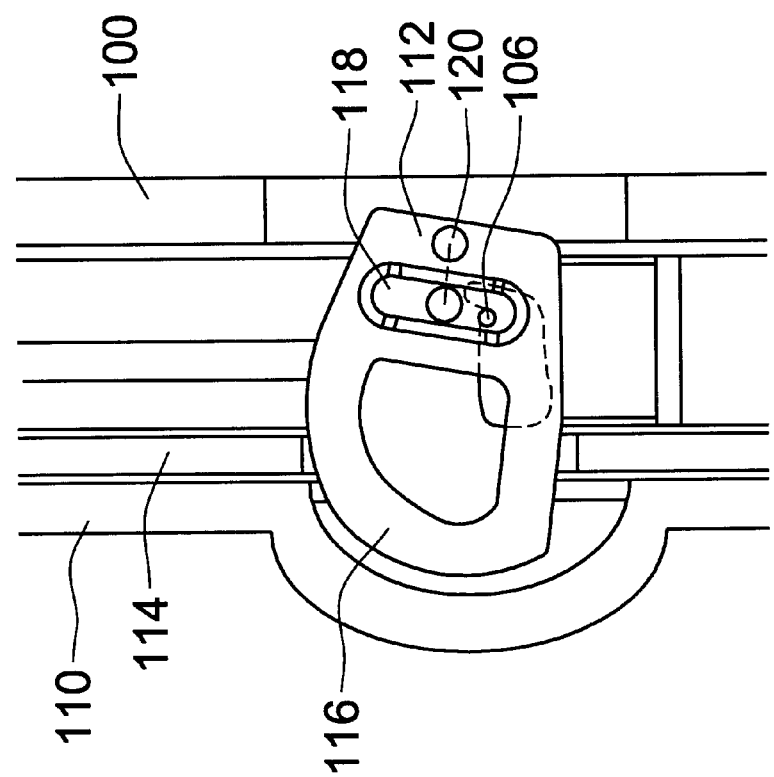
Figure 6B:
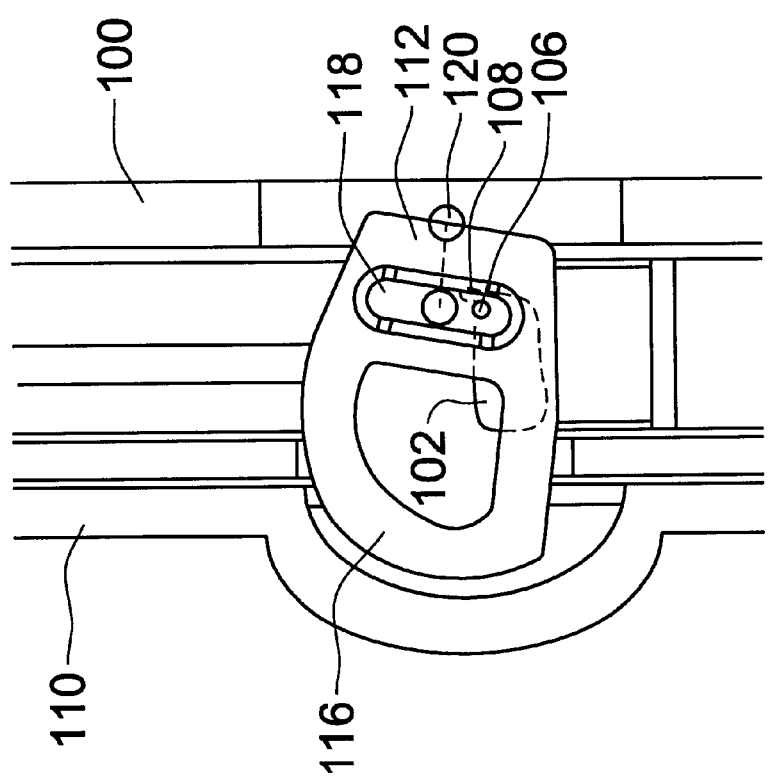

On the other hand, referring to the bottom view of FIGS. 6A through 6D, when the pod is located on a support surface (not shown), an actuation pin 120 seats in slot 118. Once the pod is properly positioned on a support surface, a motor beneath the support surface actuates the pins laterally outward (to the right from the perspective of FIGS. 6A–6D). Upon moving laterally, in addition to moving the latch 112, actuation pin 120 bears against the angled portion 108 (FIGS. 2 and 6A–6D) so as to deflect latch lock 102 and finger 106 downward from the view shown in FIGS. 6A–6D (i.e., substantially perpendicular to the movement of the actuation pin 120). In moving downward, the finger 106 moves out of slot 118 and no longer prevents the latch 112 from moving laterally so that the engagement portion 116 may move clear of the pod door as shown in FIG. 6D.

As is further shown in FIG. 6D, once the latch 112 is moved laterally to free the pod door from the pod, the actuation pin 120 also moves clear of the latch lock 102. At this point, the latch lock moves back to its unflexed position. Thus, while the pod door is clear of the pod during processing of the workpiece(s), the latch lock is unflexed so as to minimize fatigue on the latch lock. When in the position shown in FIG. 6D, the finger 106 resides in a detent formed on the top side of the perimeter latch (shown in phantom in the bottom views of FIGS. 6A through 6D). The finger 106 abuts against the wall of the slot 118 and is prevented from entering this detent unless the finger is first deflected downward by the actuation pin 120 at the same time the perimeter latch 112 moves laterally.

After processing of the work pieces within the pod is completed, and the pod door is returned to its mated position with the pod shell, the actuation pins 120 may move the latch 112 back to its coupling position (i.e. the engagement pin 120 moves to the left with respect to the views shown in FIGS. 6A–6D). When the actuation pin 120 begins its lateral movement to the left from the perspective of FIGS. 6A through 6D, the finger 106 is again deflected downward by the pin 120 as the perimeter latch is moved to the left so that the finger can once again seat within the slot 118 (FIG. 6A). Once returned to this home position, the actuation pins 120 no longer contact the angled portion 108 of the latch locks 102 so that the latch locks 102 return to their undeflected position.

Although the invention has been described in detail herein, it should be understood that the invention is not limited to the embodiments herein disclosed. Various changes, substitutions and modifications may be made thereto by those skilled in the art without departing from the spirit or scope of the invention.

What is claimed is:

1. A latch mechanism for latching a first member to a second member, said latch mechanism comprising:
   (a) a latch lock mounted to said first member, said latch lock comprising:
      (i) a finger portion; and
      (ii) an angled portion angled with respect to said finger portion;
   (b) a latch mounted to said first member, said latch adapted to move between a latched position and an unlatched position, said latch comprising:
      (i) an engagement portion adapted to contact a portion of said second member when said latch is in said latched position so as to maintain contact between said first member and said second member; and
      (ii) a slot for receiving said finger of said latch lock; and
   (c) an actuation pin extending from a support surface, positioned in said slot of said latch, when said second member is seated on the support surface, and adapted to move laterally between a first position and a second position, said actuation pin adapted to slidably contact said angled portion such that when said actuation pin moves between said first position and said second position said angled portion moves in a direction orthogonal to the lateral movement such that said finger portion is moved into and out of said slot, said latch adapted to move between said latched and unlatched positions when said finger portion is not positioned in said slot.

2. A latch mechanism according to claim 1, further comprising a spring adapted to mount said latch to said first member.

3. A latch mechanism according to claim 2, wherein said spring is a leaf spring.

4. A latch mechanism according to claim 2, wherein said spring is adapted to allow said latch to move between said latched and unlatched positions, said spring being flexed when said latch is in said unlatched position.

5. A latch mechanism according to claim 1, wherein said slot has a wall portion, and said finger portion is adapted to contact said wall portion to prevent said engagement portion from losing contact with said second member when said finger portion is in said slot.

6. A latch mechanism according to claim 1, wherein said actuation pin is further adapted to move clear of said latch when said finger portion is out of said slot.

7. A latch mechanism according to claim 6, wherein said latch lock is adapted to move back to said latched position when said first and second members are not in contact.

8. A latch mechanism for latching a pod door to a pod shell, said latch mechanism comprising:
   (a) a latch lock mounted to the pod shell, said latch lock comprising:
      (i) a finger portion; and
      (ii) an angled portion angled with respect to said finger portion;
   (b) a latch mounted to the pod shell, said latch adapted to move between a latched position and an unlatched position, said latch comprising:
      (i) an engagement portion adapted to contact a portion of said door when said latch is in said latched position so as to maintain contact between the pod door and the pod shell; and
      (ii) a slot for receiving said finger of said latch lock; and
   (c) an actuation pin extending from a support surface, positioned in said slot of said latch, when said pod door and pod shell are seated upon the support surface, and adapted to move laterally between a first position and a second position, said actuation pin adapted to slidably contact said angled portion such that when said actuation pin moves between said first position and said second position said angled portion moves in a direction orthogonal to the lateral movement such that said finger portion is moved into and out of said slot, said latch adapted to move between said latched and unlatched positions when said finger portion is not positioned in said slot.

9. A latch mechanism according to claim 8, further comprising a spring adapted to mount said latch to said container and allow said latch to move between said latched and unlatched positions, said spring being flexed when said latch is in said unlatched position.

10. A latch mechanism according to claim 8, wherein said slot has a wall portion, and said finger portion is adapted to contact said wall portion to prevent said engagement portion from losing contact with said door when said finger portion is in said slot.

11. A latch mechanism according to claim 8, wherein said container has an inner wall and an outer wall, and said latch lock is formed between said inner wall and said outer wall of said container.

12. A latch mechanism according to claim 8, wherein said latch lock is molded as part of the container.

13. A latch mechanism according to claim 8, wherein said latch lock is comprised of a polymer.

14. A latch mechanism according to claim 13, wherein said polymer is selected from the group consisting of polycarbonate and acrylonitrile-butadiene-styrene (ABS).

15. A latch mechanism according to claim 8, wherein said latch lock is approximately three-quarters of an inch in length.

16. A latch mechanism according to claim 8, wherein said door and said pod shell define a sealed environment.

17. A latch mechanism for latching a pod door to a shell of a pod adapted to contain a workpiece, said latch mechanism comprising:
   (a) a latch lock mounted to said shell, said latch lock comprising:
      (i) a finger portion; and
      (ii) an angled portion angled with respect to said finger portion;
   (b) a perimeter latch mounted to said shell, said perimeter latch adapted to move between a latched position and an unlatched position, said perimeter latch comprising:
      (i) an engagement portion adapted to contact a portion of said pod door when said perimeter latch is in said latched position so as to maintain contact between said pod door and said shell; and
      (ii) a slot for receiving said finger of said latch lock; and
   (c) an actuation pin extending from a support surface, positioned in said slot of said perimeter latch when the pod is seated on the support surface, and adapted to move laterally between a first position and a second position, said actuation pin adapted to slidably contact said angled portion such that when said actuation pin moves between said first position and said second position said angled portion moves in a direction orthogonal to the lateral movement such that said finger portion is moved into and out of said slot, said latch adapted to move between said latched and unlatched positions when said finger portion is not positioned in said slot.

18. A latch mechanism according to claim 17, further comprising a spring adapted to mount said perimeter latch to said shell and allow said perimeter latch to move between said latched and unlatched positions, said spring being flexed when said perimeter latch is in said unlatched position.

19. A latch mechanism according to claim 17, wherein said pod defines a sealed environment.

20. A latch mechanism according to claim 17, wherein said workpiece is selected from the group consisting of semiconductor wafers, reticles, and flat panel displays.

21. A latch mechanism according to claim 17, wherein said pod operates according to SMIF technology.

22. A latch mechanism according to claim 17, wherein said pod comprises multiple of said latch mechanisms.

* * * * *